United States Patent
Oweyang et al.

(10) Patent No.: US 7,094,686 B2
(45) Date of Patent: Aug. 22, 2006

(54) CONTACT HOLE PRINTING BY PACKING AND UNPACKING

(75) Inventors: Dahchung Oweyang, Hsin-Chu (TW); Jian-Hong Chen, Hsin-Chu (TW); Bang-Chein Ho, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/737,024

(22) Filed: Dec. 16, 2003

(65) Prior Publication Data

US 2005/0130410 A1    Jun. 16, 2005

(51) Int. Cl.
*H01L 21/4763*    (2006.01)
(52) U.S. Cl. .................................... 438/637; 438/717
(58) Field of Classification Search ............... 438/637, 438/717
See application file for complete search history.

(56) References Cited

U.S. PATENT DOCUMENTS

| | | | |
|---|---|---|---|
| 5,308,741 A | 5/1994 | Kemp | |
| 5,573,634 A | 11/1996 | Ham | |
| 6,218,057 B1 | 4/2001 | Cirelli et al. | |
| 6,238,850 B1 | 5/2001 | Bula et al. | |
| 6,627,384 B1 * | 9/2003 | Kim et al. | 430/280.1 |
| 6,664,011 B1 * | 12/2003 | Lin et al. | 430/5 |
| 2003/0104286 A1 | 6/2003 | Lin et al. | |
| 2003/0104319 A1 | 6/2003 | Lin et al. | |
| 2004/0234897 A1 * | 11/2004 | Ho et al. | 430/312 |

OTHER PUBLICATIONS

B. J. Lin, "New /NA Scaling Equations For Resolution And Depth-Of-Focus", pp. 759-764, Proc. of SPIE vol. 4000, Optical Microlithography XIII, ed. C. Progler (Mar., 2000) Copyright SPIE.

* cited by examiner

*Primary Examiner*—W. David Coleman
(74) *Attorney, Agent, or Firm*—Duane Morris LLP; Richard A. Paikoff

(57) ABSTRACT

A method is provided for the creation of contact holes. The invention provides two masks. The first mask, referred to as the packed mask, comprises the desired contact holes, which are part of the creation of a semiconductor device. To the packed mask are added padding holes in order to increase the hole density of the packed mask. An insulation layer is formed to protect the first layer of material. The second mask, referred to an the unpacking mask, comprises openings at the same locations as the locations of the padding holes of the first mask, the openings provided in the second mask have slightly larger dimensions than the padding holes of the first mask. A first exposure is made using the packed mask, a second exposure of the same surface area is made using the unpacking mask. The unpacking mask is used to selectively cover the padding contact holes, resulting in the final image. Two types of unpacking masks can be used, a first type having unpacking holes that surround the desired hole pattern, a second type having unpacking holes that align with the desired hole pattern.

15 Claims, 7 Drawing Sheets

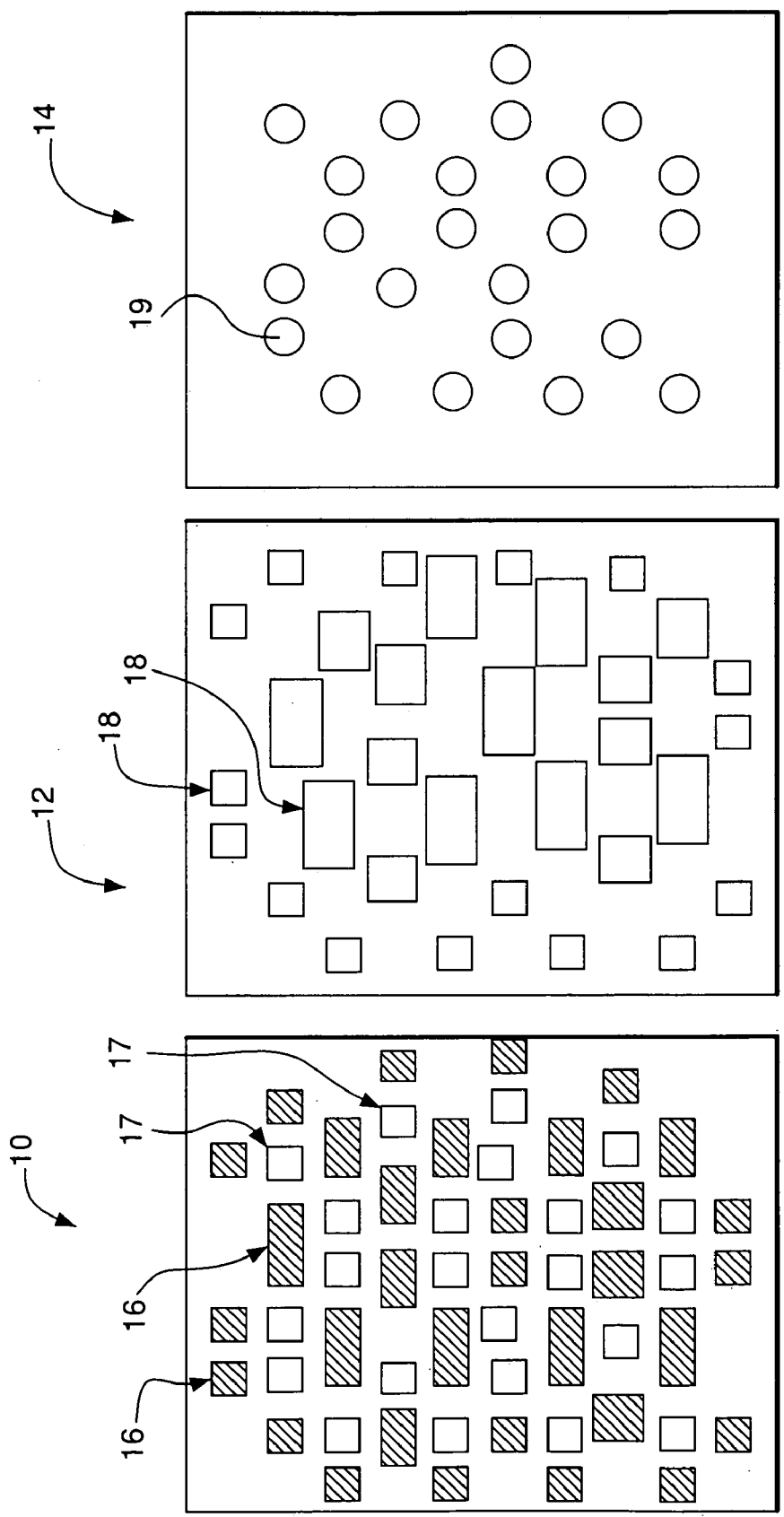

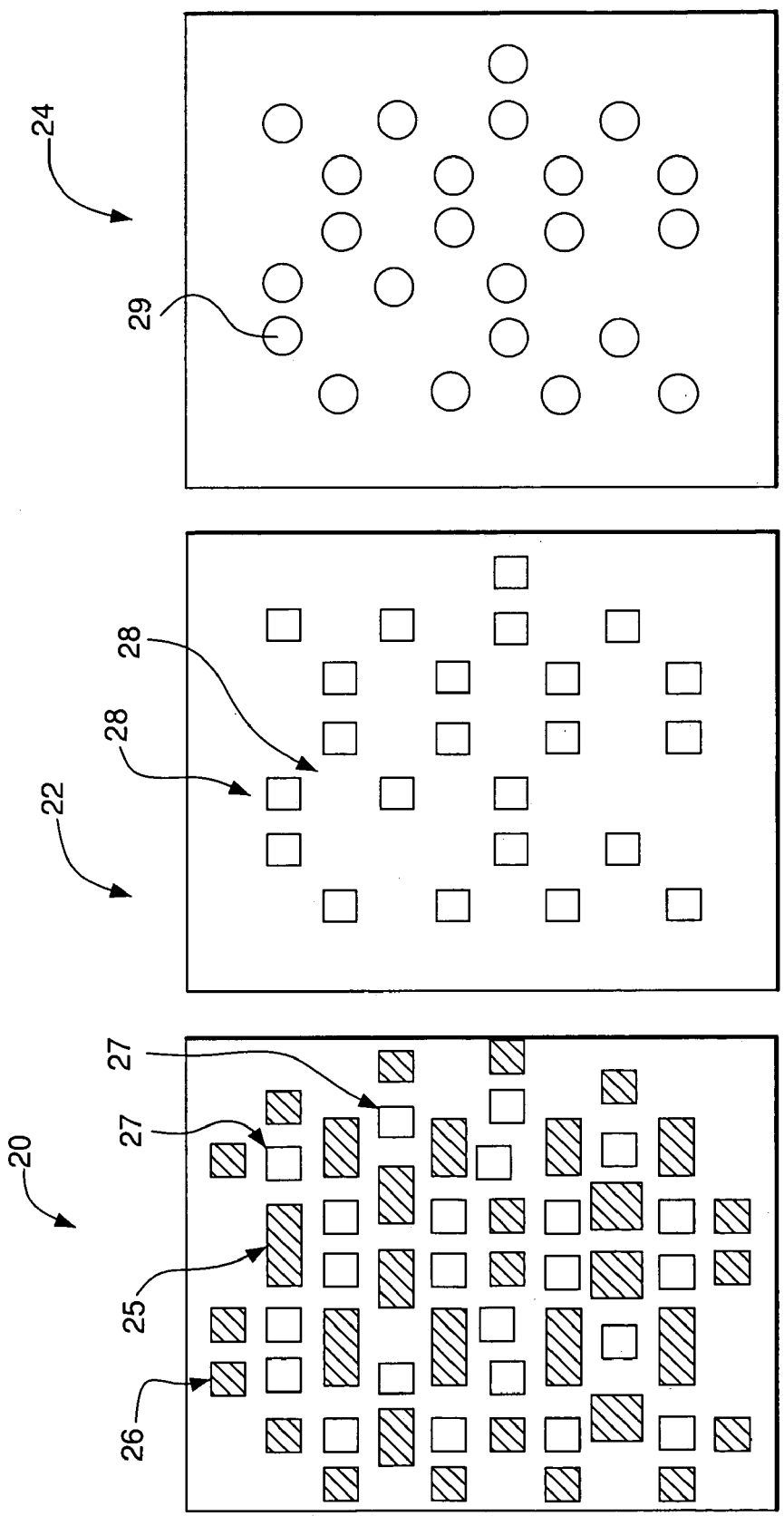

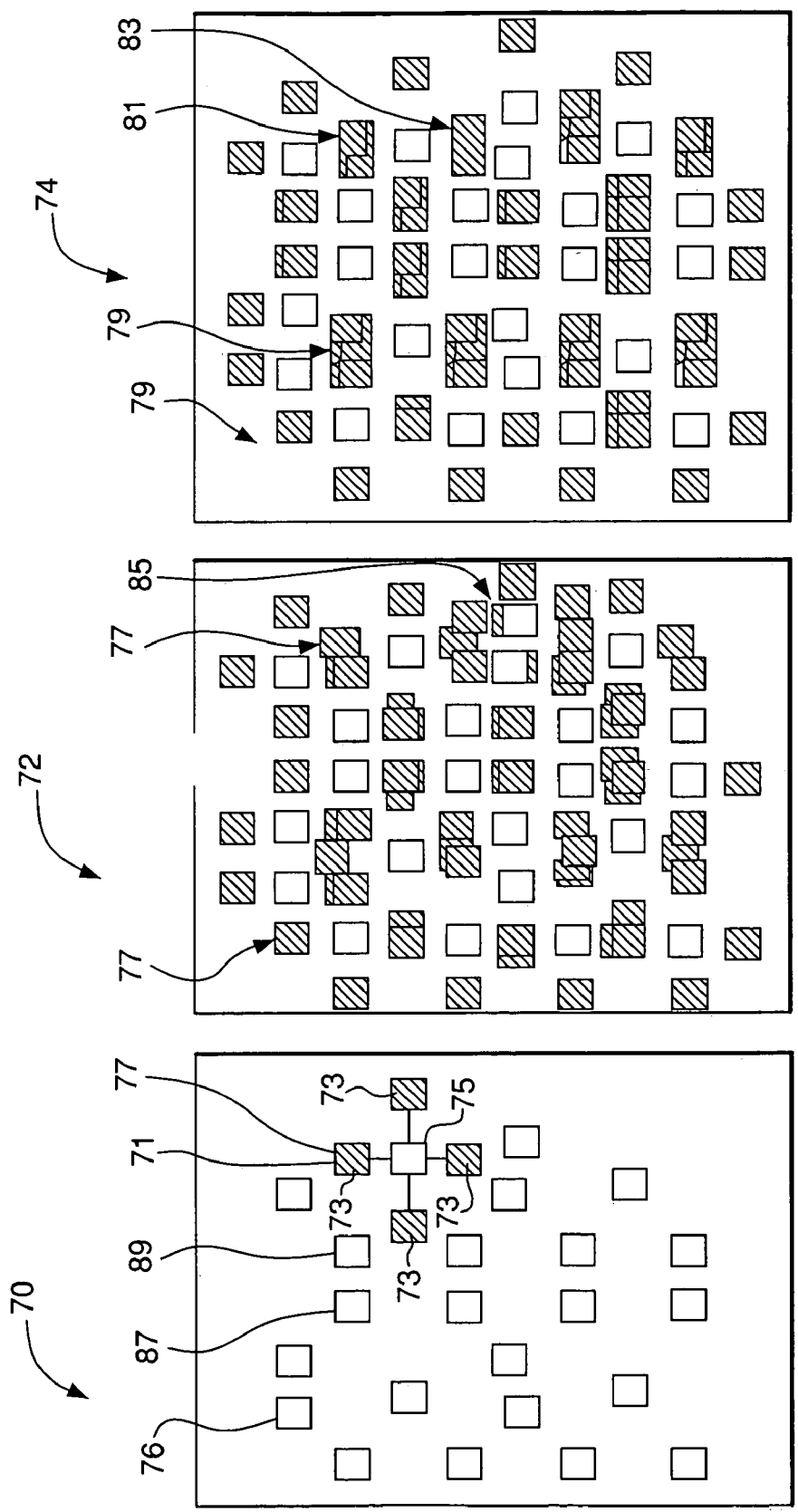

CONTACT HOLE PRINTING BY PACKING AND UNPACKING

BACKGROUND OF THE INVENTION

1. Field of the Invention

The invention relates to the fabrication of integrated circuit devices, and more particularly, to a method of improved contact hole creation for ultra-small contact holes.

2. Description of the Prior Art

Integrated semiconductor devices comprise electronic circuits of sub-micron and deep sub-micron dimensions and are typically created in or on the surface of a silicon substrate. The creation of semiconductor devices is supported by sophisticated and interacting, mutually supporting disciplines.

Device features are transposed from a mask onto a semiconductor surface using photolithographic imaging processes. Since this exposure depends on the transfer of photo energy from a source to a target surface, it is to be expected that, for target features that are created in very close proximity to each other, the transfer of photo energy interacts for very closely spaced device features, most commonly interconnect lines or contact holes having sub-micron spacing between adjacent lines.

A common measure for the occurrence of such interactions are applications where the Critical Dimensions (CD) of the layout of the Integrated Circuit (IC) approach the resolution limit of the lithography equipment. For such applications, proximity effects begin to influence the manner in which mask images are transferred to target surfaces. This interaction imposes limitations on the proximity of adjacent device features; these limitations are referred to as Critical Dimensions (CD) of a design and device layout.

The invention addresses problems and limitations that are encountered when creating openings on a semiconductor surface such as the surface of a layer of photoresist or the surface of a semiconductor substrate.

U.S. Pat. No. 5,573,634 (Ham) shows a double exposure contact hole method.

U.S. Pat. No. 6,218,057 (Cirelli et al.) shows a lithographic process for contact holes using 2 masks/exposures.

U.S. Pat. No. 6,238,850 (Bula et al.) shows a photo method for contact holes using 2 masks/exposures.

U.S. Pat. No. 5,308,741 (Kemp), U.S. Pat. No. 5,897,975 (Ahn et al.) and U.S. Pat. No. 5,795,686 (Takizawa et al.) are related photo methods.

SUMMARY OF THE INVENTION

A principal objective of the invention is to provide a method of creating contact holes of sub-micron dimensions whereby the provided method is not limited to holes of one hole-diameter to hole-distance ratio.

Another objective of the invention is to provide a method of creating contact holes of sub-micron dimensions whereby the range of the ratio of hole-diameter to hole-distance is narrowed to an optimum range of off axis illumination.

Another objective of the invention is to provide a method of creating contact holes using a packing and unpacking procedure.

Another objective of the invention is to provide improved Depth Of Focus (DOF) during the creation of contact holes.

Yet another objective of the invention is to improve a Mask Error Factor (MEF) associated with the creation of contact holes.

Thus, the present invention relates to a method of creating closely spaced contact holes, comprising the steps of: (1) providing a substrate, said substrate having been provided with a first layer of material for creation of a pattern of contact holes; (2) exposing the surface of said first layer of material with a first mask, said first mask comprising a first and a second pattern of contact holes; (3) creating openings in said first layer of material in accordance with said first and second pattern of contact holes; (4) forming an insulation layer over the first layer of material, wherein (i) a difference in polarity is used to form the protection of the first layer; (ii) a water solution which includes a water soluble resin, a thermal acid generator and a cross-linker is coated over the first layer of material; (iii) a thermal process is applied, wherein the water soluble resin undergoes a cross-linking reaction under catalysis by acid to form the insulation layer, followed by; (iv) a water-rinse step to remove unreacted components; (5) depositing a second layer of material over the surface of said protected first layer of material, including said openings created in said first layer of material in accordance with said first and second pattern of holes; (6) exposing the surface of said second layer of material with a mask selected from the group consisting of: (i) a second mask comprising a third pattern of holes, said third pattern of holes being aligned with said second pattern of holes, said third pattern of holes being a transparent pattern of holes with a surrounding opaque background surface; (ii) a third mask comprising a third pattern of holes, said third pattern of holes being aligned with said second pattern of holes, said third pattern of holes being an opaque pattern of holes with a surrounding transparent background surface; (iii) a fourth mask comprising a fourth pattern of holes, said fourth pattern of holes being aligned with said first pattern of holes, said fourth pattern of holes being a transparent pattern of holes with a surrounding opaque background surface; (iv) a fifth mask comprising a fourth pattern of holes, said fourth pattern of holes being aligned with said first pattern of holes, said fourth pattern of holes being an opaque pattern of holes with a surrounding transparent background surface; and (7) creating openings or covering in said second layer of material in accordance with said third or fourth pattern of holes, holes of said third or fourth pattern of holes having a diameter being larger than a diameter of holes of said first and second pattern of holes by a measurable amount.

In accordance with the objectives of the invention a new method is provided for the creation of contact holes. The invention provides two masks. The first mask, referred to as the packed mask, comprises the desired contact holes, which are part of the creation of a semiconductor device; in the present invention, an insulation coating is applied over the patterns from the printing of the first mask. To the packed mask are added padding holes in order to increase and condense the hole density of the packed mask. The second mask, referred to as the unpacking mask, comprises openings at the same locations as the locations of the padding holes of the first mask, the openings provided in the second mask have slightly larger dimensions than the padding holes of the first mask. An alternative approach for the second mask includes openings at the same location of the desired holes of the first mask, but with larger dimensions. A first exposure is made using the packed mask, a second exposure of the same surface area is made using the unpacking mask. The unpacking mask is used to selectively cover the padding contact holes or to open the desired contact holes, resulting in the final image. Two types of unpacking masks can be used, a first type having unpacking holes that surround the desired hole pattern, a second type having unpacking holes that align with the desired hole pattern.

BRIEF DESCRIPTION OF THE DRAWINGS

FIGS. 1a through 1c show a top view of a pack-and-cover scheme that is based on padding holes.

FIGS. 2a through 2c show a top view of a pack-and-cover scheme that is based on the desired holes.

FIGS. 4a through 4c show a top view of desired holes, the padding holes that are added and the resulting, combined hole pattern.

DESCRIPTION OF THE PREFERRED EMBODIMENTS

Figure 3A:
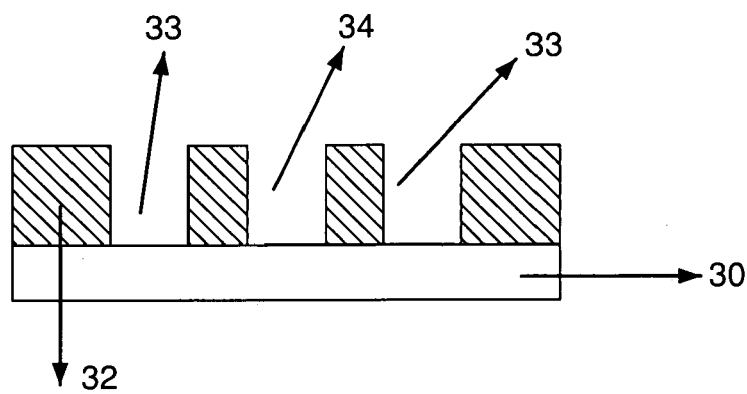
FIGS. 3a through 3e show a cross section of two layers of photoresist to which hole printing have been applied using the Packing And Unpacking (PAU) method of the invention. It is formed by adding an insulation layer prior to the second layer.

The invention addresses the problems that are typically caused in imaging contact holes. In past practices, these problems have been addressed by off-axis illumination in the form of annular, quadruple of dipole configurations. This method however is highly dependent on the density of the created images and can be optimized for only one density of images at the time. The invention provides a method of creating contact holes that improves Depth Of Focus (DOF) and a Mask Error Factor (MEF) for the creation of the contact holes. The invention purposely packs the holes up in order to reduce the spread of pitches and to take advantage of the improvement of off-axis illumination to closely packed and equally pitched features. Proximity effects have to be corrected but are effectively irrelevant to the invention.

In applying conventional micro-photolithography with a reduction of the feature size below 0.4 lambda/NA, where lambda is the actinic wavelength and NA is the numerical aperture of the imaging lens, the depth of focus (DOF) is on the order of 0.21 lambda/NHA, where NHA is the numerical half aperture. To create 0.1 µm contact holes, using a wavelength of 193 nm and a NA of 0.65, the feature size is 0.34 lambda/NA and the DOF is about 0.32 µm. In addition, the Mask Error Factor (MEF), which is defined as the ratio between the incremental change of the image dimension and the incremental change of the object dimension on the mask, is on the order of 4.0. Both indicated values of DOF and MEF are unacceptable for the creation of contact holes for sub-micron and deep-sub-micron semiconductor devices. The invention provides a method for the improvement of both DOF and MEF for such contact holes.

Methods have been provided to improve the DOF of closely packed contact holes with off-axis illumination. This off-axis illumination can be applied in annular, quadruple or bipolar configurations, but the location of these configurations can be optimized only for a specific packing density. For example, only the image of holes with a hole-diameter to hole-separation ratio of 1:1 is optimized. After this optimization has been implemented for the 1:1 ratio, holes with a ratio of 1:2 benefit to a lesser extent than the 1:1 ratio holes. This decrease in benefit is even more pronounced for holes that are further separated, such as isolated holes. Alternately, holes may be optimized for a hole-diameter to hole-separation ratio of 1:2, with worsened results for holes that are packed closer and holes that are packed less tightly than the optimized holes.

The invention addresses the above stated concerns by providing two masks. The first mask, referred to as the packed mask, comprises the desired contact holes, which are part of the creation of a semiconductor device. An insulation layer is then coated over the first resist image. This insulation layer is preferably a water solution which includes a water soluble resin, a thermal acid generator and a cross-linker. After the solution is coated, high temperature baking may be applied.

During the thermal process, the water soluble resin undergoes the cross-linking reaction under catalysis by acid to form the insulation layer. The acid is generated by heat from the thermal acid generator in the water solution, or by exposure of the first resist. In a preferred embodiment, the cross-linking reaction forms an insulation layer on the surface of the first resist image. A water-rinse step follows to remove unreacted components.

In a further preferred embodiment, a compatible second layer resist is coated on the delineated insulation layer and first resist image. Note that either positive or negative resist may be used for the second layer. When a negative resist is chosen, a dark field unpacking mask based on padded holes exposes the second layer resist at the padded holes to make them insoluble in the resist developer, resulting in coverage of the padded holes. Alternatively, a light-field unpacking mask, based on the desired holes, exposes the negative second layer resist in all areas, except where the desired holes are located, and results in coverage of the background.

Note that when a positive resist is chosen for the second layer, a light-field unpacking mask based on the padding holes results in coverage of the padded holes, and a dark-field unpacking mask based on the desired holes results in coverage of the background.

To the packed mask are added padding holes in order to increase the hole density of the packed mask and to reduce the range of hole pitches. The second mask, referred to as the unpacking mask, comprises openings at the same locations as the locations of the padding holes of the first mask; the openings provided in the second mask have slightly larger dimensions than the padding holes of the first mask. A first exposure is made using the packed mask, a second exposure of the same surface area is made using the unpacking mask. The unpacking mask is used to selectively cover the padding contact holes, resulting in the final image. Two types of unpacking masks can be used, a first type having unpacking holes that surround the desired hole pattern, a second type having unpacking holes that align with the desired hole pattern.

To formalize and further expand the above stated procedures of the invention, these procedures can be stated as follows:

the invention provides a first mask, images of the desired holes and of padding holes are provided in the first mask the invention provides a second mask, unpacking images are provided in the second mask, the unpacking images align with the padding images; the images that are provided in the second mask are slightly larger than the corresponding images of the padding holes of the first mask the first and the second mask can be implemented by making the mask background surface (which surrounds the therein created images) opaque, the therein created images being transparent the first and the second mask can be implemented by making the mask background surface (which surrounds the therein created images) transparent, the therein created images being opaque the application of the first and the second mask can be further extended, using a first layer of photoresist, in which a pattern of holes is created using the two masks of the invention, and an insulation coating is applied above the first layer; this pattern of holes can then further be extended by the deposition of a second layer of photoresist of the surface of the protected patterned first layer of photoresist, the second layer of photoresist is in turn patterned and developed positive and negative photoresist can be used special arrangements can be made relating to spacing the holes that are created, and special arrangements can be made relating to providing extra holes surrounding the holes that are created, the diameter of these extra holes can be adjusted with respect to the diameter of the holes that are created.

The invention will now be further explained using FIGS. 1a through 7c. For these explanations, the following must be kept in mind. Photolithography is a common approach wherein patterned layers are usually formed by spinning on a layer of photoresist, projecting light through a photomask with the desired pattern onto the photoresist to expose the photoresist to the pattern, developing the photoresist, washing off the undeveloped photoresist, and plasma etching to clean out the areas where the photoresist has been washed away. The exposed resist may be rendered soluble (positive working) and form the pattern, or insoluble (negative working) and be washed away.

FIG. 1a through 1c show the application of the packed and the unpacking mask where the unpacking features provided in the unpacking mask align with the padding holes in the packed mask. unpacking features and referring specifically to FIGS. 1a through 1c, there is shown:

10, FIG. 1a, a top view of the packed mask

12, FIG. 1b, a top view of the unpacking mask

14, FIG. 1c, a top view of the final image 16, a top view of padding holes contained in the packed mask 10

17, a top view of desired holes contained in the packed mask 10

18, a top view of the unpacking features contained in the unpacking mask 12; it must be noted that the unpacking features 18 in unpacking mask 12 are in the same relative positions (align with) within the mask 12 as the padding holes 16 in the packed mask 10; it must further be noted that the unpacking features 18 are slightly larger dimensions than padding holes 16, and 19, a top view of the final images of the desired holes.

FIGS. 2a through 2c show the application of the packed and the unpacking mask where the unpacking features provided in the unpacking mask align with the desired holes in the packed mask. Referring specifically to FIGS. 2a through 2c, there is shown:

20, FIG. 2a, a top view of the packed mask

22, FIG. 2b, a top view of the unpacking mask

24, FIG. 2c, a top view of the final image 26, a top view of padding holes contained in the packed mask 20

27, a top view of desired holes contained in the packed mask 20

28, a top view of the unpacking features contained in the unpacking mask 22; it must be noted that the unpacking features 28 in unpacking mask 22 are in the same relative positions (align with) within the mask 28 as the desired holes 27 in the packed mask 20; it must further be noted that the unpacking features 28 are slightly larger dimensions than the desired holes 27, and 29, a top view of the final images of the desired holes.

FIGS. 3a–e show cross sections of implementations of the masks of the invention.

Shown in cross section in FIGS. 3a through 3e are:

30, FIG. 3a, a semiconductor surface over which a pattern of holes (desired holes) is to be created; this semiconductor surface typically is the surface of a monocrystalline silicon substrate 32, a first layer of photoresist, coated over surface 30

Figure 3B:
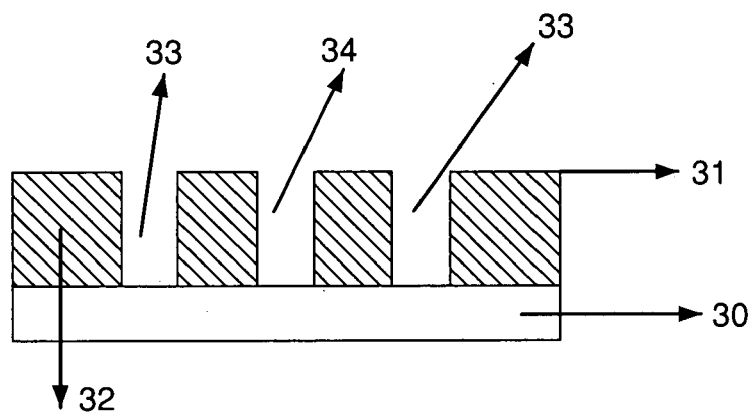
Figure 3C:
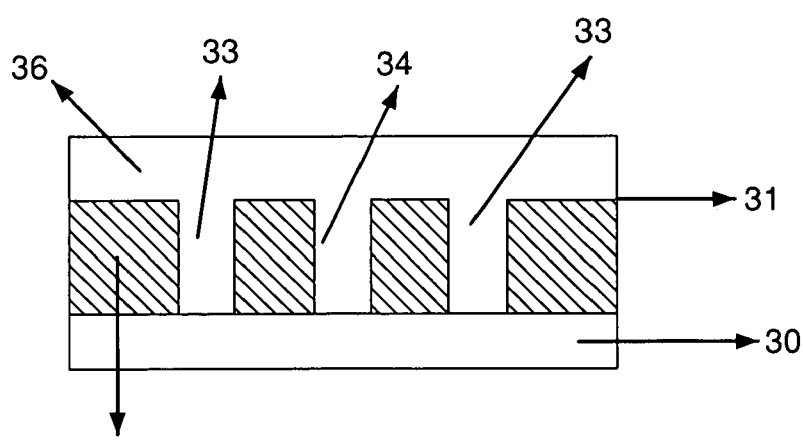
Figure 3D:
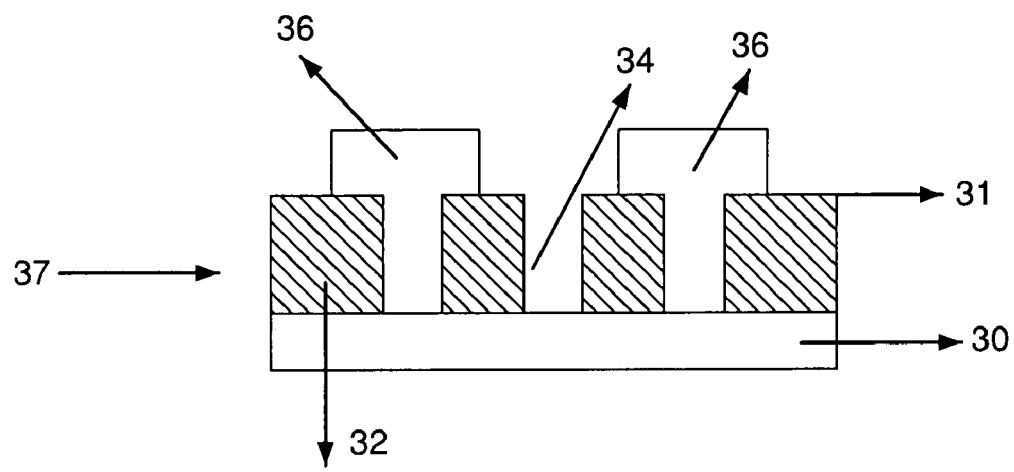
Figure 3E:
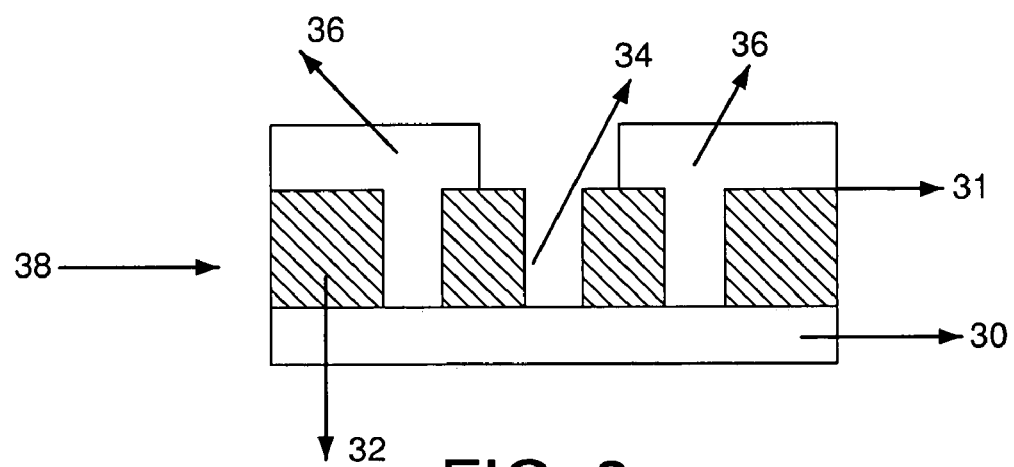

33, a padded hole created through the first layer 32 of photoresist 34, a desired hole created through the first layer 32 of photoresist 31, FIG. 3b, an insulation layer, formed over the first layer 32 of photoresist 36, FIG. 3c, a second layer of photoresist, coated over surface of the insulation layer 31 and the patterned first layer 32 of photoresist, including openings 33 and 34 created in the first layer 32 of photoresist 37, FIG. 3d, a first cross section that shows unpacking results, resulting in filling padded hole 33, and 38, FIG. 3e, a second cross section that shows unpacking results, resulting in filling padded hole 33 and in filling the background.

Five cross sections are shown in FIGS. 3a through 3e with the processing steps that are required to create these cross sections. The sequences of FIGS. 3a, 3b, 3c and 3d and of FIGS. 3a, 3b, 3c and 3e relate to the masks as shown in FIGS. 1a through 1c as follows:

FIG. 3a shows a cross section after exposure and development of the first layer 32 of photoresist with a mask comprising desired contact holes and dummy padding contact holes, that is mask 10 of FIG. 1a. FIG. 3b shows a cross section of forming an insulation layer 31 to protect the patterns of the first layer 32 of photoresist. FIG. 3c shows a cross section of coating the second layer of photoresist 36, without any impact on the first layer of photoresist 32 due to the protection by the insulation layer 31.

FIG. 3d shows a cross section after exposure and development of the second layer 36 of photoresist with a mask 12, FIG. 1b, comprising unpacking features, with the unpacking features being opaque and the mask background being transparent, not exposing the padded holes (since the unpacking features align with the padded holes), using positive photoresist for layer 36 so that the exposed surface of the layer 36 is soluble and is washed away after exposure, the layer 36 of photoresist remains in place overlying the padded hole, with the remaining layer 36 of photoresist being slightly larger than the padded hole 33.

FIG. 3d further shows a cross section after exposure and development of the second layer 36 of photoresist with a mask 12, FIG. 1b, comprising unpacking features, with the unpacking features being transparent and the mask background being opaque, exposing the padded holes (since the unpacking features align with the padded holes), using negative photoresist for layer 36 so that the exposed surface of the layer 36 is insoluble, the layer 36 of photoresist remains in place overlying the padded hole, with the remaining layer 36 of photoresist being slightly larger than the padded hole 33.

FIG. 3e shows a cross section after exposure and development of the second layer 36 of photoresist with a mask 22, FIG. 2b, comprising unpacking features, with the unpacking features being transparent and the mask background being opaque, exposing the desired holes (since the unpacking features align with the desired holes), using positive photoresist for layer 36 so that the exposed surface of the layer 36 is soluble and is washed away after exposure, the layer 36 of photoresist remains in place overlying the desired hole, with the remaining layer 36 of photoresist being slightly larger than the desired hole 34.

FIG. 3e further shows a cross section after exposure and development of the second layer 36 of photoresist with a mask 22, FIG. 2b, comprising unpacking features with the unpacking features being opaque and the mask background being transparent, exposing the desired holes (since the unpacking features align with the desired holes), using negative photoresist for layer 36 so that the exposed surface of the layer 36 is insoluble, the layer 36 of photoresist remains in place overlying the desired hole, with the remaining layer 36 of photoresist being slightly larger than the desired hole 34.

FIGS. 4a through 4c show a sequence of mask layouts that follows the process of creation from an original layout to packed mask layout, as follows:

- 70, FIG. 4a, the desired hole pattern provided on the surface of a mask
- 72, FIG. 4b, a pattern of padded holes that is added to the desired hole pattern 70
- 74, FIG. 4c, a mask of the combined desired holes and the padding holes
- 76, the desired holes provided in the mask 70
- 77, the padding hole provided in the mask 72
- 71, one of the desired holes that has been selected as an example, four padding holes 73 have been added to the desired hole 71
- 75, the distance between the desired hole 71 and the four surrounding padding holes 73; it is noted that the pattern that is created by the four padding holes 73 is applied to each of the desired holes 76, this is shown in the view 72
- 79, an example of combined padding holes; by comparing the view 72 with the view 74, it is clear that added padding holes that overlap or that essentially overlap are combined into one padding hole, such as for instance padding holes 81 and 83.

Further explanations that relate to the highlighted drawings are provided next in order to further explain the invention. FIGS. 3a through 3e show the two-resist coating process to perform PAU. The first layer of photoresist is exposed with the packed mask and developed as usual. A compatible second layer of photoresist is coated on the delineated image in the first layer of photoresist image without affecting it. For some second layers of photoresist, in order to preserve the first photoresist image, an insulation layer is formed. When a negative resist is chosen, a dark-field unpacking mask, which is based on the padded holes (mask 12, FIG. 1b, with unpacking features 18 being transparent and the background of the mask that surrounds the unpacking features 18 being opaque), exposes the second layer of photoresist at the padded holes to make the padded holes insoluble in the resist developer, resulting in coverage of the padded holes (see also FIG. 5a for additional details). Alternately, a light-field unpacking mask, which is based on the desired holes (mask 22, FIG. 2b, with unpacking features 28 being opaque and the background of the mask that surrounds the unpacking features 28 being transparent), exposes the negative second layer of photoresist in all areas except where the desired holes are located and results in coverage of the background (see also FIG. 8d for additional details). When a positive photoresist is chosen for the second layer of photoresist, a light-field unpacking mask, which is based on the padding holes (mask 12, FIG. 1b, with unpacking features 18 being opaque and the background of the mask that surrounds the unpacking features 18 being transparent), results in coverage of the padded holes (see also FIG. 8b for additional details) while a dark-field unpacking mask (mask 22, FIG. 2b, with unpacking features 28 being transparent and the background of the mask that surrounds the unpacking features 28 being opaque), which is based on the desired holes, results in coverage of the background (see also FIG. 5c for additional details).

One method to add the padding holes is shown in FIGS. 4a through 4c. Four padding holes 73, which are similar in size with the desired hole 71, are placed at the four sides of 71 as shown in FIG. 4a. They are separated from 71 by a distance 75. FIG. 4a is a plot of the desired holes with the exception of the four padding holes 73 for illustration purpose. The process of adding four holes to one desired hole continues until all desired holes are treated as shown in FIG. 4b. Notice that the padding holes may overlap each other irregularity as in cluster 77 or they may overlap a desired hole as in cluster. Cluster 77 is actually constituted from the padding holes to desired holes 71, 87 and 89. For cluster 77, a rectangle enclosing all three overlapping padding holes is drawn and replaces the three padding holes as shown in FIG. 4c. For cluster 85, the padding holes are simply omitted.

The invention, in view of the number of independent parameters that can be selected in the creation of the desired openings, involves a somewhat complex thought process that can perhaps best be focused by a set of drawings, for this reason drawings FIGS. 5a through 5d are provided.

In viewing these drawings, the following must be realized:

- the pattern that is created in the first layer of photoresist, see FIG. 3a, is a base pattern that applies to all of these drawings
- an insulation layer is formed to protect the base pattern, see layer 31, FIG. 3b.
- a second layer of photoresist is deposited over the base pattern, see layer 36, FIG. 3c; this second layer of photoresist is patterned, creating an opening in this layer of photoresist that in all cases and by definition must align with the desired opening, that is opening 34, FIG. 3a.

Figure 5A:
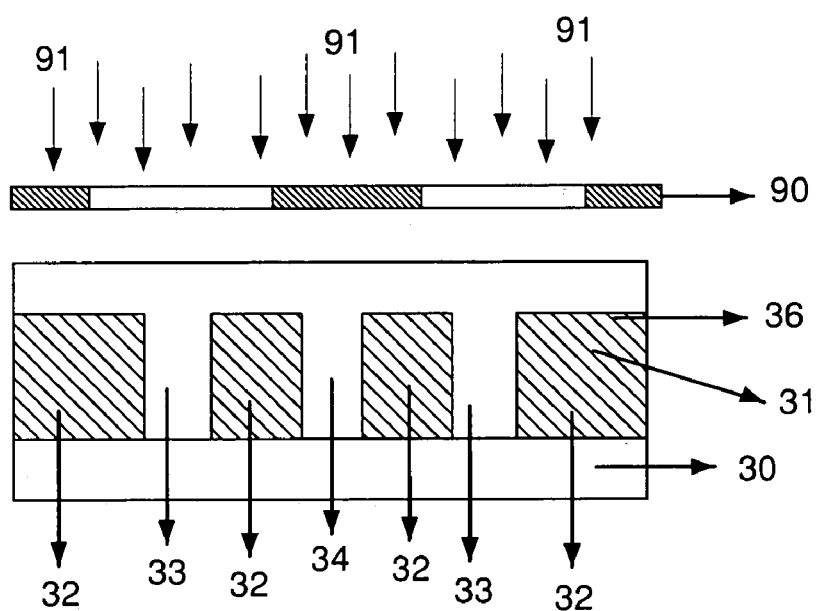
FIGS. 5a through 5d show combinations of mask patterns and layers of photoresist.
Figure 5B:
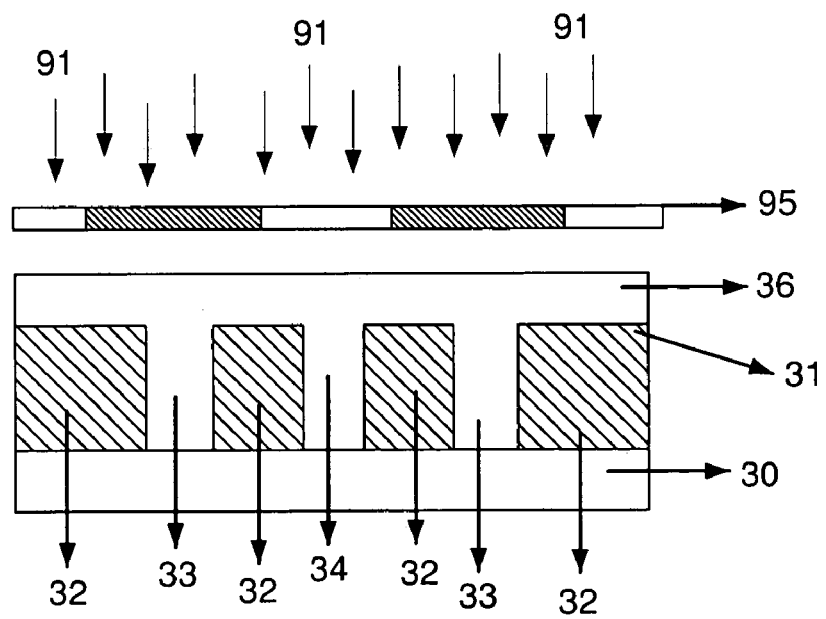

Using mask 12, FIG. 1b, where the unpacking features do not align with the desired holes but align with the padding holes, the second layer of photoresist will only be removed from the desired holes under one of two conditions:

1. the second layer of photoresist is a negative layer of photoresist and the unpacking mask exposes (exposure 91) the padding holes, that is the unpacking features of the unpacking mask are transparent and the surrounding background surface of the unpacking mask is opaque; see FIG. 5a where layer 36 is a negative (second) layer of photoresist, mask 90 has an opening that aligns with the padding holes and does not align with the desired hole 34.
2. the second layer of photoresist is a positive layer of photoresist and the unpacking mask does not expose the padding holes, that is the unpacking features of the unpacking mask are opaque and the surrounding background surface of the unpacking mask is transparent; see FIG. 5b where layer 36 is a positive (second) layer of photoresist, mask 95 is opaque in a surface area of the mask 95 that aligns with the padding holes and does not align with the desired hole 34.

The above two conditions can be summarized as follows, using the same sequence of conditions as followed above:
1. a packed mask is used for creating closely spaced contact holes, creating a first pattern of contact holes (holes 34, FIG. 5*a*) and a second pattern of contact holes (holes 33, FIG. 5*a*). A mask 90, FIG. 5*a*, is used comprising a pattern of contact holes, the pattern of holes in the mask 90 is aligned with the second pattern of holes 33, FIG. 5*a*, the pattern of holes in mask 90 comprising a transparent pattern of holes with a surrounding opaque background surface
2. a packed mask is used for creating closely spaced contact holes, comprising a first pattern of contact holes (holes 34, FIG. 5*b*) and a second pattern of contact holes (holes 33, FIG. 5*b*). A mask 95, FIG. 5*b*, is used comprising a pattern of holes, said pattern of holes in mask 95 being aligned with said second pattern of holes 33, said pattern of holes in mask 95 being an opaque pattern of holes with a surrounding transparent background surface.

Figure 5C:
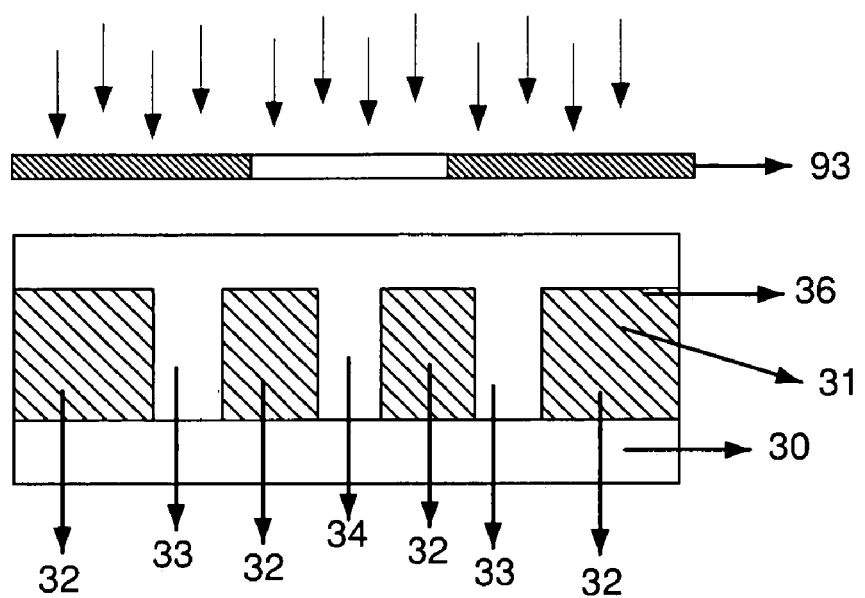
Figure 5D:
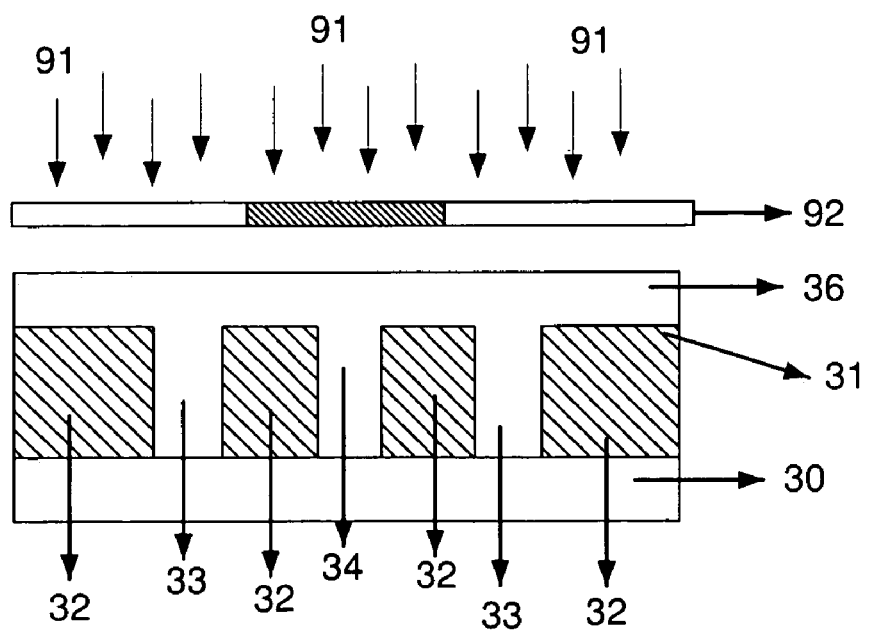

Using mask 22, FIG. 2*b*, where the unpacking features align with the desired holes and do not align with the padding holes, the second layer of photoresist will only be removed from the desired holes under one of two conditions:
1. the second layer of photoresist is a positive layer of photoresist and the unpacking mask exposes the desired holes, that is the unpacking features of the unpacking mask are transparent and the surrounding background surface of the unpacking mask is opaque; see FIG. 5*c* where layer 36 is a positive (second) layer of photoresist, mask 93 has an opening that aligns with the desired hole 34.
2. the second layer of photoresist is a negative layer of photoresist and the unpacking does not expose the desired holes, that is the unpacking features of the unpacking mask are opaque and the surrounding background surface of the unpacking mask is transparent; see FIG. 5*d* where layer 36 is a negative (second) layer of photoresist, mask 92 is transparent in a surface area of the mask 93 that aligns with the desired hole 34.

The above two conditions can be summarized as follows, using the same sequence of conditions as followed above:
1. a packing and unpacking mask is used for creating closely spaced contact holes, comprising a first pattern of contact holes 34, FIG. 5*c*, and a second pattern of contact holes 33, FIG. 5*c*. A mask 93, FIG. 5*c*, is used comprising a pattern of holes, the pattern of holes in mask 93 being aligned with the first pattern of holes 34, the pattern of holes in mask 93 being a transparent pattern of holes with a surrounding opaque background surface.
2. a packing and unpacking mask is used for creating closely spaced contact holes, comprising a first pattern of contact holes 34, FIG. 5*d*, and a second pattern of contact holes 33, FIG. 5*d*. A mask 92, FIG. 5*d*, is used comprising a pattern of holes, said pattern of holes in mask 92 being aligned with said first pattern of holes 34, FIG. 5*d*, said pattern of holes in mask 92 being an opaque pattern of holes with a surrounding transparent background surface.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:
1. A method of creating closely spaced contact holes, comprising the steps of:
   (1) providing a substrate, said substrate having been provided with a first layer of material for creation of a pattern of contact holes;
   (2) exposing the surface of said first layer of material with a first mask, said first mask comprising a first and a second pattern of contact holes;
   (3) creating openings in said first layer of material in accordance with said first and second pattern of contact holes;
   (4) forming an insulation layer over the first layer of material, wherein
      (i) a difference in polarity is used to form the protection of the first layer;
      (ii) a water solution which includes a water soluble resin, a thermal acid generator and a cross-linker is coated over the first layer of material;
      (iii) a thermal process is applied, wherein the water soluble resin undergoes a cross-linking reaction under catalysis by acid to form the insulation layer, followed by;
      (iv) a water-rinse step to remove unreacted components;
   (5) depositing a second layer of material over the surface of said protected first layer of material, including said openings created in said first layer of material in accordance with said first and second pattern of holes;
   (6) exposing the surface of said second layer of material with a mask selected from the group consisting of:
      (i) a second mask comprising a third pattern of holes, said third pattern of holes being aligned with said second pattern of holes, said third pattern of holes being a transparent pattern of holes with a surrounding opaque background surface;
      (ii) a third mask comprising a third pattern of holes, said third pattern of holes being aligned with said second pattern of holes, said third pattern of holes being an opaque pattern of holes with a surrounding transparent background surface;
      (iii) a fourth mask comprising a fourth pattern of holes, said fourth pattern of holes being aligned with said first pattern of holes, said fourth pattern of holes being a transparent pattern of holes with a surrounding opaque background surface;
      (iv) a fifth mask comprising a fourth pattern of holes, said fourth pattern of holes being aligned with said first pattern of holes, said fourth pattern of holes being an opaque pattern of holes with a surrounding transparent background surface; and
   (7) creating openings in said second layer of material in accordance with said third or fourth pattern of holes, holes of said third or fourth pattern of holes having a diameter being larger than a diameter of holes of said first and second pattern of holes by a measurable amount.

2. The method of claim 1, said first pattern of holes comprising contact holes.

3. The method of claim 1, said second pattern of holes comprising dummy holes.

4. The method of claim 1, wherein said creating openings in said second layer of material in accordance with said third or fourth pattern of holes comprises the steps of:
   selecting a negative photoresist for said second layer of material;
   providing said second mask;

aligning said third pattern of holes provided in said second mask with said second pattern of holes created in said first layer of material;

exposing the surface of said second layer of material in accordance with said third pattern of holes provided in said second mask; and developing said second layer of material in accordance with said third pattern of holes provided in said second mask.

5. The method of claim 1, wherein said creating openings in said second layer of material in accordance with said third or fourth pattern of holes comprises the steps of:

selecting a positive photoresist for said second layer of material;

providing said third mask;

aligning said third pattern of holes provided in said third mask with said second pattern of holes created in said first layer of material;

exposing the surface of said second layer of material in accordance with said third pattern of holes provided in said second mask; and developing said second layer of material in accordance with said third pattern of holes provided in said second mask.

6. The method of claim 1, wherein said creating openings in said second layer of material in accordance with said third or fourth pattern of holes comprises the steps of:

selecting a positive photoresist for said second layer of material;

providing said fourth mask;

aligning said fourth pattern of holes provided in said fourth mask with said second pattern of holes created in said first layer of material;

exposing the surface of said second layer of material in accordance with said fourth pattern of holes provided in said fourth mask; and developing said second layer of material in accordance with said fourth pattern of holes provided in said fourth mask.

7. The method of claim 1, wherein said creating openings in said second layer of material in accordance with said third or fourth pattern of holes comprises the steps of:

selecting a negative photoresist for said second layer of material;

providing said fifth mask;

aligning said fourth pattern of holes provided in said fifth mask with said second pattern of holes created in said first layer of material;

exposing the surface of said second layer of material in accordance with said fourth pattern of holes provided in said fifth mask; and developing said second layer of material in accordance with said fourth pattern of holes provided in said fifth mask.

8. The method of claim 1 wherein said first layer of material comprises photoresist.

9. The method of claim 1, said second layer of material comprising photoresist.

10. The method of claim 1, said holes of said second pattern being created by adding one additional hole to each side of holes of said first pattern.

11. The method of claim 10, said one additional hole being separated from said each side of holes of said first pattern by an equal distance.

12. The method of claim 11, said equal distance being within a range of between one time and two times the size of a largest cross section of said first hole.

13. The method of claim 10, said one additional hole having a cross section of a size about equal to a cross section of holes of said first pattern.

14. The method of claim 1 wherein overlapping holes of said second pattern of holes are combined into larger holes.

15. The method of claim 10, said one additional hole added to each side of holes of said first pattern being eliminated where said one additional hole overlaps holes of said first pattern of holes.

* * * * *